(12) United States Patent
Finlayson

(10) Patent No.: US 7,046,288 B1
(45) Date of Patent: May 16, 2006

(54) IMAGE RECORDING APPARATUS EMPLOYING A SINGLE CCD CHIP TO RECORD TWO DIGITAL OPTICAL IMAGES

(75) Inventor: Graham Finlayson, Norwich (GB)

(73) Assignee: University of East Anglia, Norwich (GB)

( * ) Notice: Subject to any disclaimer, the term of this patent is extended or adjusted under 35 U.S.C. 154(b) by 0 days.

(21) Appl. No.: 09/720,572

(22) PCT Filed: Jun. 25, 1999

(86) PCT No.: PCT/GB99/01997

§ 371 (c)(1),
(2), (4) Date: Mar. 22, 2001

(87) PCT Pub. No.: WO00/01164

PCT Pub. Date: Jan. 6, 2000

(30) Foreign Application Priority Data

Jun. 27, 1998 (GB) .................................. 9813855

(51) Int. Cl.
*H04N 5/225* (2006.01)
(52) U.S. Cl. .................................. 348/342; 348/218.1
(58) Field of Classification Search ................ 348/272, 348/218.1, 342, 239, 178; 250/208.1
See application file for complete search history.

(56) References Cited

U.S. PATENT DOCUMENTS

| | | | |
|---|---|---|---|
| 5,045,928 A | 9/1991 | Takaiwa et al. | |
| 5,479,524 A | 12/1995 | Farrell et al. | |
| 5,734,337 A * | 3/1998 | Kupersmit | 340/937 |
| 6,256,066 B1 * | 7/2001 | Yukawa et al. | 348/340 |
| 6,700,613 B1 * | 3/2004 | Bryant et al. | 348/342 |

FOREIGN PATENT DOCUMENTS

EP    0 605 898    7/1994

OTHER PUBLICATIONS

Finlayson, Graham D. and Drew, Mark S., "Constrained least-squares regression in color spaces," *Journal of Electronic Imaging*, Oct. 1997, vol. 6(4), pp. 484-493.

* cited by examiner

*Primary Examiner*—James J. Groody
*Assistant Examiner*—Heather R. Jones
(74) *Attorney, Agent, or Firm*—Smith-Hill and Bedell

(57) ABSTRACT

An image recording apparatus for processing an image includes a camera (10), or other optical sensor means, for recording a first digital optical image of at least part of a scene illuminated by an illuminant light and for recording a second digital optical image of at least a part of substantially the same scene under substantially the same illuminant light. The images may be recorded on respectively different sensor arrays (12a and 12b). The light producing the first and second images undergoes different optical processing in order to produce those images, and processing means (18) in communication with the optical sensor means is provided for processing information relating to the first and second images. By relating the two images, the processing means (18) is able to provide information regarding the color of the illuminate light or other physical properties of the illuminated scene.

31 Claims, 4 Drawing Sheets

IMAGE RECORDING APPARATUS EMPLOYING A SINGLE CCD CHIP TO RECORD TWO DIGITAL OPTICAL IMAGES

CROSS REFERENCE TO RELATED APPLICATION

This is a national stage application filed under 35 USC 371 based on International Application No. PCT/GB1999/001997 filed Jun. 25, 1999, and claims priority under 35 USC 119 of United Kingdom Patent Application No. 9813855.5 filed Jun. 27, 1998.

The present invention relates to image recording apparatus for processing an image. The invention also relates to a method for recording an image with image recording apparatus and processing the recorded image.

An image here refers to a record of a part or the whole of a scene to be recorded; the image may comprise a part or the whole of the record of the scene. An image may comprise a part of a scene in spatial terms. For example, an image may comprise only a central area of a recorded scene. Further, an image may comprise part of a scene in terms of the frequencies of light recorded. For example a first image of a scene might record mainly red light while a second image of the same scene records mainly green light.

An image recorded by a camera, or by computer vision, remote sensing or image processing systems, and the like is generally dependent upon the colour of the light illuminating the scene to be recorded. An image may also be affected by the shape of an object in the scene, by shadows and reflections in the scene, or by the camera or system itself. It is desirable that any effect that these parameters have on an image be known. Knowledge of these effects can assist in the removal of colour bias from an image and can provide important information concerning the physical characteristics of the scene being viewed.

According to the invention there is provided image recording apparatus for processing an image, the apparatus including:

optical sensor means for recording a first digital optical image of at least a part of a scene illuminated by an illuminant light and for recording a second digital optical image of at least a part of substantially the same scene under substantially the same illuminant light;

the light producing the first and second images undergoing different optical processing; and means in communication with the optical sensor means for processing information relating to the first and second images.

Preferably the processing means relates one of the first and second images to the other of the first and second images.

Preferably the processing means correlates the first and second images.

First and second optical sensor means may be provided for recording the first and second images respectively.

Preferably at least one of the first and second optical sensor means is relatively broadband optical sensor means. Preferably the broadband optical sensor means are responsive to at least two distinct wavelengths of light within a broad spectrum of wavelengths. Preferably the wavelengths are at least 50 nm apart and preferably at least 100 nm apart. They may be as much as 150 nm apart. Preferably the broad spectrum is at least 100 nm wide and preferably at least 200 nm wide. It may be as much as 300 nm wide. The optical sensor means may include at least two types of optically sensitive elements, responsive to respectively different wavelengths of light.

The other of the first and second optical sensor means may be relatively narrow band, being particularly responsive to wavelengths of light within a spectrum less than 100 nm wide.

However, it is preferred that both of the first and second optical sensor means are relatively broadband optical sensor means.

The optical sensor means preferably comprises a charge coupled device (CCD) chip, the chip comprising an array of photoelectric detector pixels. The pixels preferably have a broad response centering on a particular wavelength of light. The response may be to red, green or blue light. The particular response of the CCD chip may be achieved by it being coated with a filter. Alternatively, the optical sensor means may comprise a CMOS device. Where a CCD chip is referred to throughout the specification, it should be understood that a CMOS device could alternatively be used.

The optical processing means preferably comprises an optical filter. The filter preferably has characteristics such that its output is linearly related to its input. Preferably the response of the filter is a smooth function with respect to wavelength. Desirably the filter is highly transmitting and may have an average transmittance of more than 10%, preferably more than 20% and most preferably more than 30%. The filter preferably produces an output which includes relatively more light of one wavelength than of another wavelength as compared with the input. The output may contain relatively more green light or more purple light than the input. The filter is preferably located in the image light path before the optical sensor means. The filter may be provided on or in front of the optical sensor means. The filter may be provided as a coating on the optical sensor means.

The first and second optical sensor means may be provided by a single CCD chip which records the first and second digital optical images. The first and second sensor means may comprise respectively different parts of the chip. The first and second images may comprise different parts of the image recorded by the CCD chip, in spatial terms or in terms of the frequencies of light recorded. The parts of the image may be discrete or may overlap.

The filter may be provided in front of or on a part of the CCD chip such that the first or second digital optical image is recorded by that part of the chip, and the other of the digital optical images is recorded by the remainder of the chip. Preferably the filter is provided in front of or on a central part of the CCD chip. The part of the CCD chip preferably represents between 1°–6° of its total visual field. The optical sensor means and the optical processing means are preferably located within a housing, such as a camera body.

Alternatively, the first image may comprise certain frequencies of light recorded by the CCD chip and the second image may comprise different frequencies of light recorded by the CCD chip. The frequencies may overlap.

In another embodiment of the invention, the optical sensor means advantageously comprises a first CCD chip for recording the first digital optical image and a second CCD chip for recording the second digital optical image. Preferably the chips are located in close proximity to one another. The chips are desirably located in the same geometric plane.

The two CCD chips may be responsive to respectively substantially the same frequencies of light. The optical processing means preferably comprises an optical beamsplitter for splitting the image light into two parts and for directing each part of the light towards a respective one of the CCD chips, and an optical filter, the filter being located in the path of one part of the image light, before one CCD chip. The filter may be provided on the one CCD chip. The optical sensor means and the optical processing means are preferably located within a housing, such as a camera body.

In another embodiment of the invention, each CCD chip is advantageously provided in a separate housing, a first housing having a CCD chip provided therein and a second housing having a CCD chip and an optical filter provided therein.

In a further embodiment of the invention, a first CCD chip is provided within a first digital camera and a second CCD chip is provided within a second digital camera, such that the different optical processing of the two images results from the different camera characteristics. In this embodiment, a filter is not necessarily required.

The two chips may be responsive to respectively different frequencies of light. In this case, the different optical processing results from the different responses of the chips and a filter is not necessarily required.

The processing means is preferably microprocessor based, having electrical memory means. The processing means may be a computer.

The processing means may include means for providing information relating to the spectral characteristics of the illuminant light.

The information relating to the spectral characteristics of the illuminant light may be used to facilitate removal of at least some of any illuminant colour bias present in the recorded image. The processing means may alternatively or additionally include means for facilitating the removal of at least some of any demosaicing errors and/or interreflection errors and/or shadows present in the recorded image. The processing means may further additionally or alternatively include means for providing information relating to the physics of the scene, such as the physical characteristics of the scene.

According to the invention, there is also provided a method for recording an image, the method including the steps of:
  (a) recording a first digital optical image of at least a part of a scene illuminated by an illuminant light and recording a second digital optical image of at least a part of substantially the same scene illuminated by substantially the same illuminant light;
  the light producing the first and second images undergoing different optical processing; and
  (b) processing information relating to the first and second images.

Preferably the processing step includes relating one of the first and second images to the other of the first and second images. Preferably the first and second images are correlated.

The different optical processing may result at least partly from the filtering of light producing the first or second image.

Alternatively the different optical processing may be provided by the use of sensors responsive to respectively different frequencies of light in recording the first and second images.

The first and second images may comprise respectively different parts of a global image of a scene. The parts may differ in spacial terms or in terms of the frequencies of light recorded. The parts of the image may be discrete or may overlap.

Where the first and second images comprise respectively different parts of an image in spatial terms, the light producing one of the first and second images is preferably filtered.

The first image may comprise a record of certain frequencies of light while the second image comprises a record of respectively different frequencies. The frequencies may overlap. The light for both images may originate from the same scene. In this case a filter is not necessarily used.

Alternatively the first and second images may comprise a record of respectively substantially the same scene or part of a scene. The first and second images may comprise records of respectively substantially the same frequencies. In this case, preferably the light producing the first image or the second image is optically filtered.

Preferably the processing of the information relating to the first and second images provides an estimate of the spectral characteristics of the illuminant light.

The method may be used for calibrating image recording apparatus wherein steps (a) and (b) are carried out for each of a plurality of different known illuminant lights. Preferably step (b) includes the step of processing the information relating to the first and second images to provide an indication of the relationship therebetween. The indication of the relationship is preferably a transform function, which may be a transform matrix. Preferably the calibration provides a set of reference transform functions, each transform function relating to a different known illuminant light. The set may consist of at least 10 transform functions, and preferably at least 20 transform functions. Alternatively, the calibration may provide a parameterized continuous set of transform functions.

Preferably the reference transform functions are recorded in an electrical memory means.

The method may also be used for processing an image recorded using image recording apparatus wherein the first and second images relate to a scene illuminated by an unknown illuminant.

The processing of the recorded image may include the step of applying one or more of the reference transform functions to the first or second image. Preferably the reference transform function which best relates the two images is determined. Each reference transform function may be applied to the first image to produce a transformed first image, which is subsequently compared to the second image. Preferably the reference transform function which produces a transformed first image most closely resembling the second image is selected as the best reference transform function. Preferably the known illuminant light to which the best reference transform function relates is determined, to provide information relating to the spectral characteristics of the light illuminating the scene to be recorded. At least some of the colour bias due to the illuminating light may be removed from the image of the scene to be recorded. Alternatively or additionally, at least some demosaicing errors and/or interreflection errors and/or shadows present in the recorded image may be removed. Alternatively or additionally information relating to the physics of the scene, such as physical characteristics, may be provided. The transform function may be applied globally to the first image, or may be applied locally within the image. Information relating to which point or points within the image the transform function holds for may be used to provide information about the scene.

The reference transforms may have been determined previously, using calibration as described above.

According to the present invention there is also provided a method for recording an image with image recording apparatus and processing the recorded image of a scene illuminated by an illuminant light, the method including calibration steps of:

storing a digital response of an image recording apparatus to each of a plurality of colours of illuminant light $E(\lambda)$, in an electrical memory means;

grouping each colour of illuminant $E^a(\lambda)$ into a pair with a different colour of illuminant $E^b(\lambda)$, and for each pair of illuminants $E^a(\lambda)$ and $E^b(\lambda)$, calculating an illuminant transform function $T^{a,b}$, the transform function being the function which best maps the image recording apparatus response across the pair of illuminants, and recording the transfer function in an electrical memory means.

The number of pairs of illuminants is advantageously the same as the number of distinct illuminants, the second illuminant in each pair being defined in terms of the first. Preferably the second illuminant is an optically filtered function of the first, such that $E^b(\lambda)=E^a(\lambda)C(\lambda)$, where $E^b(\lambda)$ is the second illuminant, $E^a(\lambda)$ is the first illuminant and $C(\lambda)$ defines the optical filter response as a funtion of wavelength $\lambda$. Desirably the responses of the image recording apparatus are recorded for a set of distinct illuminants $E(\lambda)$. Further intermediate illuminants may be added through interpolation of the recorded responses.

The method may also include the following image recording steps:

recording the responses of the image recording apparatus to image light ($P_1$) from a scene to be recorded and to optically filtered image light ($P_2$) from the scene;

determining which colour of illuminant $E(\lambda)$ is closest to the colour of the illuminating light, thereby estimating the colour of the illuminating light; and removing at least some colour bias due to the illuminating light from the recorded image and/or at least some of any demosaicing errors and/or interreflection errors.

The optically filtered image light is preferably filtered using a filter which produces an output which includes relatively more light of one wavelength than the input. The output may contain relatively more green light or more purple light than the input.

The colour of the illuminating light is desirably determined by applying each transform function $T^{a,b}$ to the recorded response ($P_1$) of the apparatus to the image light and comparing the transformed response ($P_1$) to the response ($P_2$) of the apparatus to the filtered image light, the transform function which best relates the two responses being the function which identifies the colour of the image light and the filtered image light. The best transform function is preferably the function which minimizes the error of the operation ($T^{a,b}P_1-P^2$). The error is desirably the root mean square error.

Embodiments of the invention will now be described in more detail by way of example only with reference to the accompanying drawings, in which.

Figure 1:
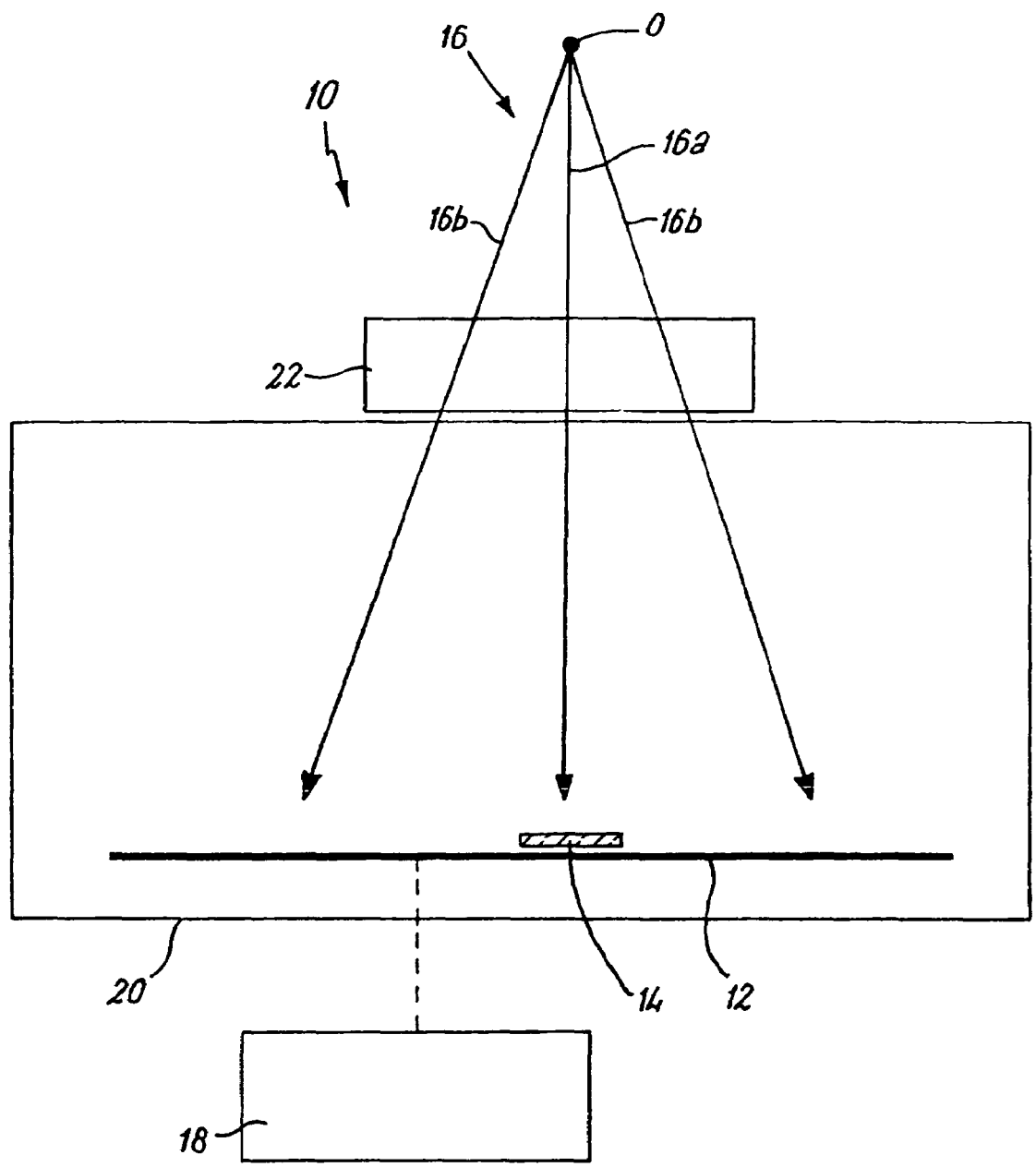
FIG. 1 is a diagrammatic representation of an image recording apparatus according to the invention.

Referring to FIG. 1, a camera 10 includes a sensor array chip or CCD 12 and an optical filter 14, located within a housing 20. The CCD 12 may be coated with the filter 14. The housing 20 is generally light-tight apart from an aperture 22 through which image light 16 from an object O enters the housing 20. Part of the image light 16a passes through the filter 14 before striking the sensor array 12, while the rest of the image light 16b travels directly to the sensor array 12. First and second images relating to the light 16a and 16b respectively, are recorded by the sensor array 12 and the image data is then passed to processing means 18 for processing to provide information regarding the colour of the illuminant light. This enables illuminant colour bias, demosaicing errors, or interreflection errors to be at least partly removed from the image, as described in more detail hereinafter.

Figure 2:
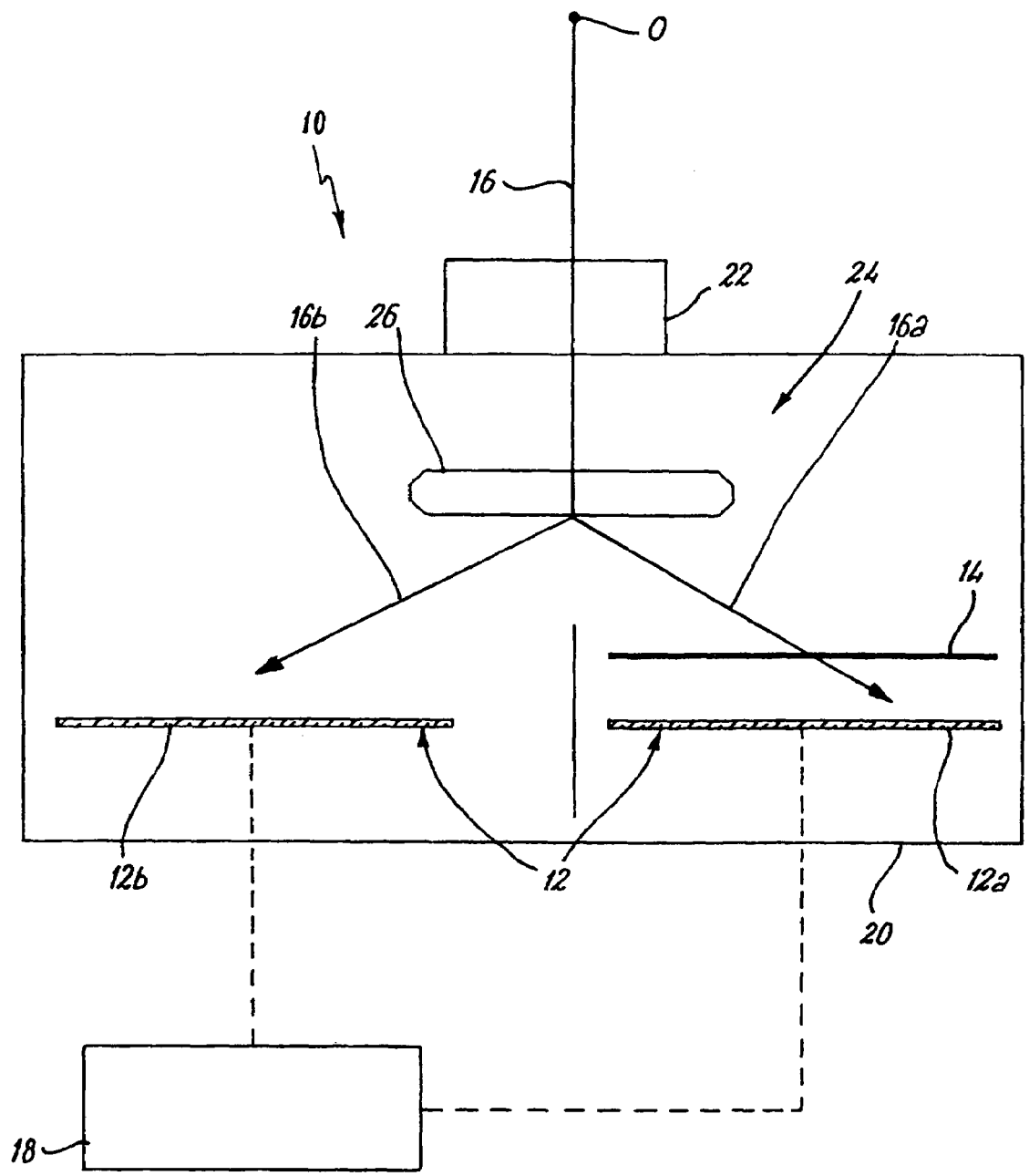
FIG. 2 is a diagrammatic representation of an alternative image recording apparatus according to the invention.

An alternative embodiment of the invention is shown in FIG. 2; the same reference numerals are used for corresponding features. Image light 16 from the object O enters the housing 20, through aperture 22, in which optical processing means 24 and two sensor arrays 12 are located. The optical processing means 24 comprises an optical beamsplitter 26 and an optical filter 14, provided in front of one sensor array 12a. On entering the housing 20, the light strikes the beamsplitter 26 and is split into two image beams 16a, 16b. One beam 16a passes through the filter 14 before striking one sensor array 12a, while the other beam 16b is passed directly to the other sensor array 12b. An image of the object O is recorded on each sensor array 12a, 12b. The image data from each sensor array 12a, 12b is then passed to the processing means 18 for processing, as described above.

Figure 3:
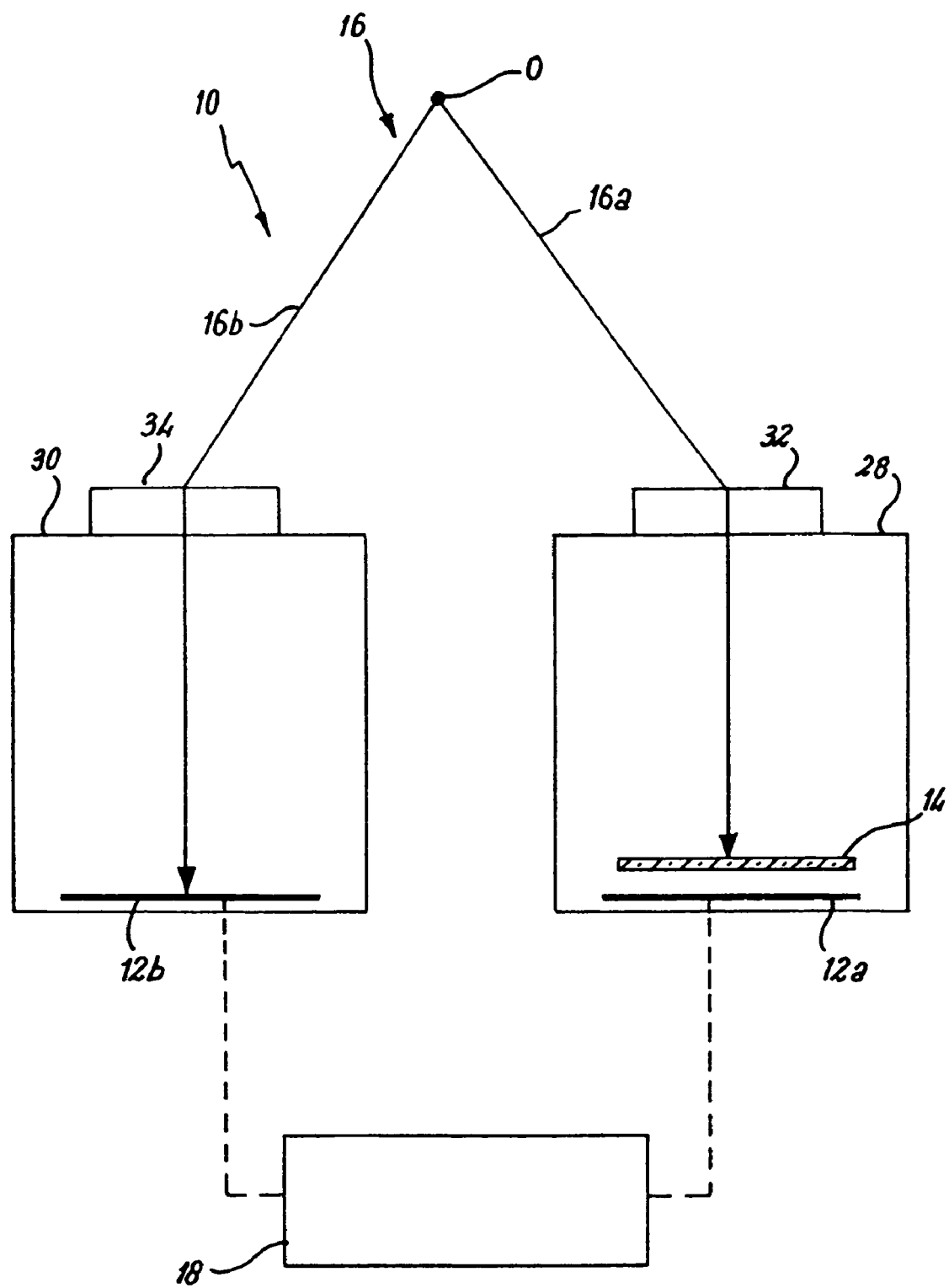
FIG. 3 is a diagrammatic representation of a further alternative image recording apparatus according to the invention.

A further embodiment of the invention is shown in FIG. 3, in which the two sensor arrays 12a and 12b are located in separate housings 28, 30. A first part of the light 16a from the object O enters one housing 28 through aperture 32, where it passes through an optical filter 14 before striking the sensor array 12a. A second part of the light 16b enters the other housing 30 through aperture 34, where it passes directly to the sensor array 12b. The image of the object O is recorded by each sensor array 12a, 12b. The image data from each sensor array 12a, 12b is then passed to the processing means 18 for processing, as described above.

Figure 4:
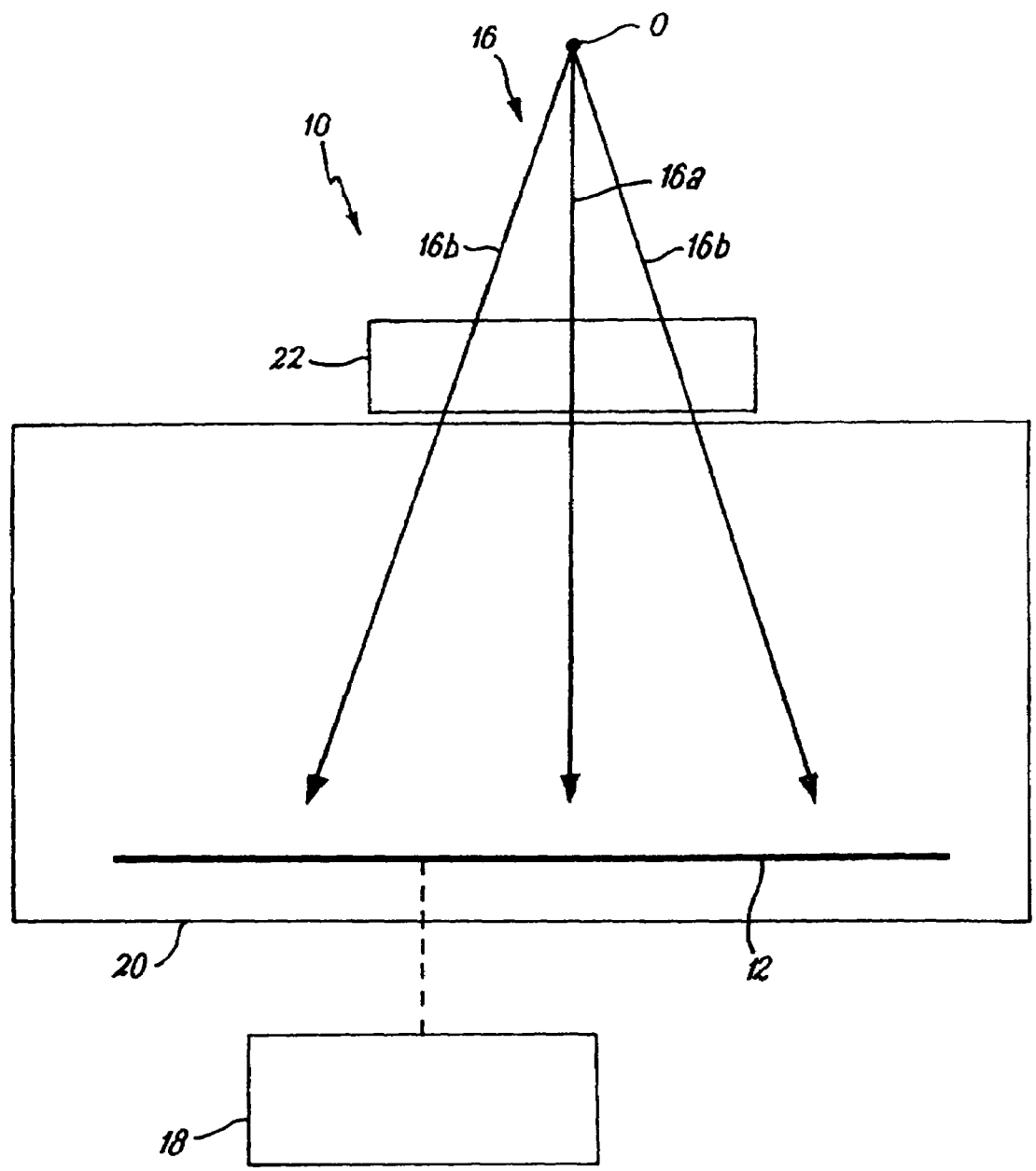
FIG. 4 is a diagrammatic representation of a further alternative image recording apparatus according to the invention.

A further alternative embodiment of the invention is shown in FIG. 4. In this embodiment, the camera 10 includes a single sensor array 12. The sensor array 12 includes six different types of pixels, responsive to respectively different frequencies of light. For example the array might include RGB pixels and R'G'B' pixels (where "'" denotes filtering). A first image of the object O is recorded by the pixels RGB and a second image of the object is recorded by the pixels R'G'B'. The image data is then passed to the processing means 18 for processing, as described above.

The image data is processed in the processing means 18 according to the method for recording an image provided by the invention.

In order to compensate for illuminant colour bias in an image recorded using image recording apparatus, such as a digital camera, the colour of the light $E(\lambda)$ illuminating the object O to be recorded is first estimated, as described below.

The response of the camera sensor array 12 can, for example, be described by the following:

$$\underline{p} = \int_\omega S(\lambda)\underline{F}(\lambda)E(\lambda)d\lambda$$

where λ is wavelength, $\underline{p}$ is a 3-vector of the response of the image recording apparatus sensor array 12 (rgb pixel value), $\underline{F}$ is the 3-vector of response functions (red-, green- and blue-sensitive), E is the illumination striking a surface of reflectance S, and ω is the visible wavelength spectrum.

In order to solve this equation for E(λ) one must have more known values than unknown values. In the present invention the image is recorded in two different wavelengths, by passing some of the image light 16a through a filter 14, as described above. If there are k distinct surfaces on the object O then the number of measurements recorded by the sensor array 12 is 2*3*k and the number of unknowns in the above equation is 3k+6 (assuming 3 dimensional linear models for the illumination and the surface). So long as there are 3 or more surfaces in the object O there will be more knowns than unknowns in the equation.

Assuming 3 surfaces in the object O, the above equation can be rewritten as $$[\underline{p}_1\ \underline{p}_2\ \underline{p}_3] = \Lambda(E^1(\lambda))[\underline{\sigma}_1\ \underline{\sigma}_2\ \underline{\sigma}_3]$$

where $\Lambda(E^1(\lambda))$ is a matrix with the ijth element equal to $$\int_\omega F_i(\lambda)E^1(\lambda)S_j(\lambda)d\lambda,$$

and $E^1(\lambda)$ is unknown illuminant 1 (image light $P_1$. Under unknown illuminant 2 (filtered image light $P_2$) the responses of the sensor array are equal to:

$$[\underline{p}_1'\ \underline{p}_2'\ \underline{p}_3'] = \Lambda(E^2(\lambda))[\underline{\sigma}_1\ \underline{\sigma}_2\ \underline{\sigma}_3]$$

The sensor array responses under the second illuminant can be expressed in terms of the responses under the first illuminant, through matrix inversion, as follows:

$$[\underline{p}_1'\ \underline{p}_2'\ \underline{p}_3'] = \Lambda(E^2(\lambda))\ \Lambda(E^1(\lambda))^{-1}[\underline{p}_1\ \underline{p}_2\ \underline{p}_3]$$

The illuminant transform matrix $(T^{a,b}) = \Lambda(E^2(\lambda))\ \Lambda(E^1(\lambda))^{-1}$ encodes all the information necessary to solve for the unknown illuminants $E^1(\lambda)$ and $E^2(\lambda)$.

The illuminant transform matrix is found by applying the method of the present invention. The digital response of the sensor array to each of a plurality of known colours of illuminant light E(λ) is recorded and stored in an electrical memory means. The response is recorded for each colour of illuminant light, $E^a(\lambda)$, and for each colour of illuminant light when optically filtered, $E^b(\lambda)$. Preferably a discrete set of colours of illuminant light are used. Preferably the chosen colours of illuminant light represent those that a scene might realistically be illuminated by, i.e. daylight at different times of the day, and internal light under a range of known lighting systems. These lights tend to include more red and blue light than green light.

Each colour of illuminant $E^a(\lambda)$ is paired with its optically filtered equivalent $E^b(\lambda)$, and the illuminant transform matrix $T^{a,b}$ calculated for each pair of illuminants $E^a(\lambda)$ and $E^b(\lambda)$. The transform matrix which best maps the sensor array response across each pair of illuminants is selected, and recorded in an electrical memory means.

Subsequently, the responses of the sensor array to the image light ($P_1$) (unknown illuminant $E^1(\lambda)$), and to the optically filtered image light ($P_2$) (unknown illuminant $E^2(\lambda)$), are recorded. The colour of the known illuminant E(λ) closest to the colour of the unknown illuminating light is determined by applying each recorded transform matrix to the sensor array response under unknown illuminant $E^1(\lambda)$, to thereby estimate the sensor response under unknown illuminant $E^2(\lambda)$. The transform matrix which produces the estimated sensor response under unknown illuminant $E^2(\lambda)$ which is closest to the recorded sensor response under unknown illuminant $E^2(\lambda)$, the filtered image light, is selected. The colour of the known illuminant $E^a(\lambda)$ to which this transform function relates can be determined. This is the known illuminant $E^a(\lambda)$ whose sensor response corresponds most closely to the sensor response, the unknown illuminant $E^1(\lambda)$. Thus the colour of the illuminating light can be estimated; the estimated illuminant light gives the closest sensor response to the sensor response of the unknown illuminant, but the spectral characteristics of the selected known illuminant may be different to the spectral characteristics of the unknown illuminant. Information relating to the known illuminant may be used to at least partially remove colour bias due to the illuminating light from the recorded image. The information may alternatively or additionally be used to remove at least some demosaicing errors and/or interreflection errors and/or shadows from the image. The information can further be used to obtain information relating to the physics of the scene, such as physical characteristics of the scene.

It is desirable that the filter produces a wide range of different transform functions for different illuminants. Once a set of known illuminants has been chosen, a number of different possible filter functions may be applied to each illuminant and then the filtered and unfiltered responses compared to work out a transform function. A filter is then chosen which produces the largest variation between transform functions for respectively different illuminants. The variance of the transform functions may be calculated using known techniques.

One way of choosing the filter is as follows. Let us represent the 3×N matrix of RGBs recorded under $E^a(\lambda)$ as $R^a$ and the corresponding filtered RGBs as $C^{a,f}$. The superscript f denotes a particular filter. The 3×3 matrix transform $T^{a,f}$ that takes $R^a$ onto $C^{a,f}$ with minimum least-squares error is equal to:

$$T^{a,f} = C^{a,f}[R^a]^+ \tag{1}$$

where $[A]^+ = A^t[A^tA]^{-1}$ is the Moore Penrose Inverse (a standard mathematical technique used to find a linear least-squares solution). Suppose we calculate the best transform matrix for a second filter f':

$$T^{a,f'} = C^{a,f'}[R^a]^+ \tag{2}$$

Since light has the property of superposition, the camera response to two lights turned on together is equal to the sum of responses from each response turned on individually. If we interpret the filtering operation as changing the illumination, it follows that:

$$C^{a,f+f'} = C^{a,f} + C^{a,f'} \tag{3}$$

From (1), (2) and (3) it is apparent that the linear sums of the filters lead to linear sums of transform matrices:

$$T^{a,f+f'} = C^{a,f}[R^a]^+ + C^{a,f'}[R^a]^+ \tag{4}$$

Let $T^{i,j}$ denote the transform matrix for illuminant i and filter j (i=1, 2, . . . , n) (j=1, 2, . . . , m). The mean transform matrix for filter j is equal to:

$$\mu(T^j) = \frac{\sum_{i=1}^{n} T^{i,j}}{n} \quad (5)$$

Let $M^{i,j}=T^{i,j}-\mu(T^j)$: the transform matrix with the mean transform matrix for the given filter subtracted. For convenience we will now composite all of the n matrices (for a fixed filter j) $M^{i,j}$ into a vector $\underline{v}^j$. The vector $\underline{v}^j$ is (3*3*n)×1.

In statistics, if $x_j$ is a scalar quantity denoting a population of m measurements and $\mu$ is the population mean, then variance is defined as:

$$\text{var}(x) = \frac{\sum_{j=1}^{n}(x_j - \mu)^2}{n} \quad (6)$$

Of course when $\mu=0$ this simplifies to $$\text{var}(x) = \frac{\sum_{j=1}^{n} x_j^2}{n} \quad (7)$$

Grouping the n values $x_j$ into an m×1 vector $\underline{x}$, then variance in (7) can be written as:

$$\text{var}(x) = (\underline{x}^t \underline{x})/n \quad (8)$$

where (8) denotes a 1×n matrix $\underline{x}^t$ premultiplying a n×1 matrix $\underline{x}$ using the usual rules of matrix algebra (8 is the dot product of two vectors).

It follows then that the variance of transforms for filter j is equal to:

$$\text{var}(T^{*,j}) = [\underline{v}^j]^t \underline{v}^j \quad (9)$$

Let us now place the vectors $\underline{v}^j$ (j=1, 2, ..., m) into the columns of a 9n×m matrix F (each column contains all the mean subtracted transforms for a particular filter). By the property of light superposition we can generate the transform matrix vector for any linear combination of the m filters simply by adding together the columns of F. Suppose that $\underline{c}$ is a coefficient vector representing the particular combination of filters we wish to make. The corresponding transform vector is equal to $F\underline{c}$. It follows then that the transform variance for any filter (constructed by a linear combination of the m original filters) is equal to:

$$\text{var}(T^{*,\underline{c}}) = \underline{c}^t F^t F \underline{c} \quad (10)$$

In designing the best filter, we wish to find the coefficient vector $\underline{c}$ that maximises (10). Looking at (10) this is trivial to do, we simply make the elements in $\underline{c}$ as large as possible. To prevent this trivial solution we must fix the magnitude of $\underline{c}$.

Let G be a 9×m matrix where the jth column is the 3×3 mean matrix $\mu(T^j)$ stretched out as a vector. It follows then the $\underline{c}^t G^t G \underline{c}$ denotes the magnitude of the mean illuminant transform matrix. If we can fix this magnitude for any derived filter then we can find $\underline{c}$ which maximises (10). This is done by adding an appropriate Lagrange multiplier term to (10):

$$\text{maximise } I = \underline{c}^t F^t F \underline{c} + \lambda(\underline{c}^t G^t G \underline{c} - 1) \quad (11)$$

To maximise (11) we must differentiate and equate to 0 in the usual way:

$$\frac{\delta I}{\delta \underline{c}} = 2F^t F \underline{c} + \lambda G^t G \underline{c} = \underline{0} \quad (12)$$

where $\underline{0}$ is the m×1 zero vector. It is clear that:

$$[G^t G]^{-1} F^t F \underline{c} = \frac{\lambda}{-2} \underline{c} \quad (13)$$

It follows that the $\underline{c}$ than maximizes (11) is an eigenvector of (13). This can be found in the usual way.

Above, we added a constraint in order to fix the magnitude of the coefficient vector $\underline{c}$. Specifically, we fixed the magnitude of the mean illuminant transform matrix. Other constraints could have been used. For example in carrying out the above minimization it is important that a large variance in transform matrices occurs in tandem with good colour correction. That is, there is no point in finding a filter that induces large transform variance, if the same filter breaks the linear model of illuminant change. It is important both that linear models accurately map RGBs across the filter correction and that there is a large variance in these transforms.

We can in fact enforce this intuition if we change the constraint matrix G defined above. Specifically let each column of G contain the difference between corrected (i.e. least-squared fitted) RGBs and corresponding filtered RGBs. Remember $T^{i,f}R^i - C^{i,f}$ denotes the RGB difference between corrected RGBs and corresponding filtered RGBs for illuminant i and filter f. It follows then that the fth column of G contains $T^{i,f}R^i - C^{i,f}$ (i=1, 2, ..., n) stretched out (as discussed above) as a long vector.

With G defined in this way, (11) seeks to maximise the variance of the transform matrices subject to the constraint that the magnitude of the error between corrected and corresponding filtered RGBs is held fixed. That is the ratio of transform variance over correction error is maximised.

In the FIG. 2 embodiment, the two sensor arrays are spatially registered so that it is possible to relate corresponding scene pixels. Thus, it is easy to take each illuminant transform matrix in turn and determine how well it relates the pixels recorded under the filtered and unfiltered lights.

For the FIG. 3 embodiment, the two cameras are mounted on a stereo head as part of an active vision system. To find corresponding points (and therefore corresponding scene pixels) to test the transform matrices involves fusing the stereo images using existing available algorithms.

It will be understood that in the FIG. 1 embodiment of the invention, a single sensor array simultaneously records the image light $P_1$ and the optically filtered image light $P_2$ The central region of the array is struck by optically filtered light, while the remainder of the array is struck by unfiltered light. Thus, no single part of the scene to be recorded is registered in both filtered and unfiltered form. Because of this, finding corresponding scene pixels is more difficult than in the embodiments shown in FIGS. 2 and 3. It is necessary to identify regions of constant surface colour which intersect the boundary between the centre of the CCD (coated with the filter) and the adjacent uncoated region. This can be done using existing techniques. Such an analysis provides corresponding colours, with and without filtering, and as such provides the means to estimate the illuminant. Alternatively the camera may be moved so that the same part of a scene may be recorded both with and without the filter.

A modification of the FIG. 4 embodiment may be made, based on an extension of the ideas previously discussed.

Since a change in illumination maps the RGB responses linearly, it follows that individual RGBs (just the red responses, just the green responses or just the blue responses) are mapped linearly (this is the definition of a linear transform). Let us focus our attention on the relationship between the original camera RGBs and the response of a single colour channel under filtering; that is let us consider how we might map 3 numbers into 1. Using the principles discussed above, a pre-processing step is carried out as follows:

1. Measure a set of known illuminants $E^1(\lambda)$, $E^2(\lambda)$, ..., $E^v(\lambda)$.
2. For each illuminant pair $E^a(\lambda)$ and $E^b(\lambda)$ calculate the illuminant transform vector $V^{a,b}$. This vector is the 1×3 matrix that best maps the RGB camera responses recorded under illuminant a to the corresponding red (or green or blue) camera responses measured under illuminant b. By definition, $V^{a,b}$ is the first (or second or third) row of $T^{a,b}$.

Camera measurements are subsequently made under an unknown illuminant.

1. $P_1$ denotes the camera measurements under the unknown illuminant. Let $p_2$ denote the corresponding red (or green or blue) row vector of measurements under a second illuminant.
2. For each plausible illuminant pair (a, b) calculate $\|V^{a,b}P_1 - p_2\|$ (where $\|.\|$ denotes root mean square error or similar).
3. Return the transform vector $V^{a,b}$ that minimises the error. Associated with this vector is the colour of the illuminant.

Clearly the 'vector' algorithm is very similar to the original method. However, because a vector is composed of three numbers in contrast to 9 for a linear transform, we expect the simplified algorithm to be less discriminatory: illuminants will induce vectors that are more similar than corresponding 9 parameter 3×3 matrices. Indeed, experiments bear out this observation. However, the vector-based algorithm leads to further simpler embodiments of a camera according to the invention.

In the modification to the FIG. 4 embodiment, the CCD includes four different types of pixels, each particularly responsive to different frequencies of light. In this embodiment the pixels are responsive to red, green and blue light and to a frequency of light (designated F) which optimises image processing.

Three of the types of pixels (RGB) are selected to record the first image, and the fourth type of pixel (F) records the second image. No filter is used. Because the pixels F are responsive to different frequencies of light to RGB, their response is equivalent (in terms of the method of the invention) to the optically filtered images of the previous embodiments.

Thus, for each known illuminant the vector which maps the RGB response to the F response is established.

Subsequently the response of the CCD to image light (an unknown illuminant) is recorded. The response of the RGB pixels is equivalent to the image light $P_1$ of the previous embodiments, while the response of the F pixels is equivalent to the optically filtered image light ($P_2$) of the previous embodiments.

The vector which best maps the RGB response to the F response is thus chosen from the set of calibration vectors. The unknown illuminant is then estimated as explained previously.

As an alternative to the above, an existing four colour camera (comprising a mosaic of cyan, magenta, yellow and green responsive pixels) could be used. Alternatively, a specially designed three colour camera (RGF) is feasible. More than one CCD could be used to increase the information provided.

There is thus provided an image recording apparatus and method which alleviates the problems caused by differing and unknown illuminant lights.

It will further be appreciated that the present invention may additionally or alternatively be used to remove other image errors from an image recorded using image recording apparatus and to obtain other information about a scene from an image of the scene recorded using image recording apparatus.

Various modifications may be made to the above embodiments while still falling within the scope of the invention.

In the embodiments which use two sensor arrays, the arrays may be arranged such that their red, green and blue responsive pixels correspond. Interpolation is preferably carried out before the two images are compared. Alternatively, the sensor arrays may be arranged such that, for example, a red responsive pixel on one array corresponds spatially to a green responsive pixel on the other array, to provide additional colour information at each pixel point.

Alternatively, three sensing arrays may be used, as in a known "three chip" camera, with a filter in front of at least one array. This provides additional colour information.

The method can be used to remove demosaicing errors, because the transform function should be applicable across the entire image. It can thus be used to detect and remove spurious coloured pixels, and to provide information concerning shadows and other artefacts caused by the physics of the scene being viewed.

As a modification to the FIG. 3 embodiment, two separate cameras each having a sensor array may be used, without a filter being provided in either camera. The cameras must have different responses such that the different optical processing of the two images results from the different camera responses.

Although the use of filters is desirable, the filters may generally be replaced by the use of differently responsive pixels. Thus, instead of mapping an RGB response onto a filtered RGB response, the RGB response could be mapped onto the response of pixels which react to different colours.

Whilst endeavouring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. Image recording apparatus (10) for processing an image, the apparatus including:
   optical sensor means (12) for recording a first digital optical image of at least a part of a scene (0) illuminated by an illuminant light and for recording a second digital optical image of at least a part of substantially the same scene under substantially the same illuminant light, the light producing the first and second images undergoing different optical processing; and means (18) in communication with the optical sensor means for processing information relating to the first and second images, wherein the processing means relates one of the first and second images to the other of the first and second images, and wherein the optical sensor means are provided by a single CCD chip (12) which records the first and second digital optical images, and a filter (14) is provided in front of or on a part of the CCD chip (12) such that the first or second digital optical image is recorded by that part of the chip, and the other of the digital optical images is recorded by the remainder of the chip.

2. Image recording apparatus (10) according to claim 1 wherein the processing means (18) correlates the first and second images.

3. Image recording apparatus according to claim 1 wherein the CCD chip comprises photoelectric detector pixels having a broad response centering on a particular wavelength of light.

4. Image recording apparatus according to claim 1 wherein the CCD chip is coated with a filter (14).

5. Image recording apparatus according to claim 1 wherein the optical processing means comprises an optical filter (14).

6. Image recording apparatus according to claim 5 wherein the filter (14) has characteristics such that its output is linearly related to its input.

7. Image recording apparatus according to claim 5 wherein the response of the filter (14) is a smooth function with respect to wavelength and the filter (14) has an average transmittance of more than 30%.

8. Image recording apparatus according to claim 5 wherein the filter (14) produces an output which includes relatively more light of one wavelength than of another wavelength as compared with the input.

9. Image recording apparatus according to claim 5 wherein the filter (14) is located in the image light path before the optical sensor means.

10. Image recording apparatus according to claim 1 wherein the first and second sensor means may comprise respectively different parts of the chip (12).

11. Image recording apparatus according to claim 1 wherein the first and second images comprise different parts of the image recorded by the CCD chip (12) in spatial terms or in terms of the frequencies of light recorded.

12. Image recording apparatus according to claim 1 wherein the processing means is microprocessor based, having electrical memory means.

13. Image recording apparatus according to claim 1 wherein the processing means includes means for providing information relating to the spectral characteristics of the illuminant light.

14. Image recording apparatus according to claim 13 wherein information relating to the spectral characteristics of the illuminant light is used to facilitate removal of at least some of any illuminant colour bias present in the recorded image.

15. Image recording apparatus according to claim 13 wherein the processing means includes means for facilitating the removal of at least some of any demosaicing errors and/or interreflection errors and/or shadows present in the recorded image.

16. Image recording apparatus according to claim 13 wherein the processing means includes means for providing information relating to the physics of the scene, such as the physical characteristics of the scene.

17. A method for calibrating image recording apparatus, the method including the steps of:
(a) recording a first digital optical image of at least a part of a scene illuminated by an illuminant light and recording a second digital optical image of at least a part of substantially the same scene illuminated by substantially the same illuminant light, the light producing the first and second images undergoing different optical processing; and
(b) processing information relating to the first and second images, wherein the processing step includes relating one of the first and second images to the other of the first and second images, and wherein the method includes the carrying out of steps (a) and (b) for each of a plurality of different known illuminant lights, step (b) includes the step of processing the information relating to the first and second images to provide a transform function indicative of the relationship between the first and second images, and the method provides a set of reference transform functions, each reference transform function relating to a different known illuminant light.

18. A method for recording an image according to claim 17 wherein the first and second images are correlated.

19. A method according to claim 17 wherein different optical processing results at least partly from the filtering of light producing the first or second image.

20. A method according to claim 17 wherein the different optical processing is provided by the use of sensors responsive to respectively different frequencies of light in recording the first and second images.

21. A method according to claim 17 wherein the first and second images comprise respectively different parts of a global image of a scene.

22. A method according to claim 17 wherein the processing of the information relating to the first and second images provides an estimate of the spectral characteristics of the illuminant light.

23. A method according to claim 17 wherein the transform function is a transform matrix.

24. A method of operating image recording apparatus that has been calibrated by a method according to claim 17, the method including the steps of:
(a) recording a first digital optical image of at least a part of a scene illuminated by an unknown illuminant and recording a second digital optical image of at least a part of substantially the same scene illuminated by substantially the same illuminant, the light producing the first and second images undergoing different optical processing,
b) applying at least two reference transform functions to the first or second image recorded in step (a), and
c) determining which reference transform function better relates the first and second images recorded in step (a).

25. A method according to claim 24 wherein each reference transform function is applied to the first image to produce a transformed first image, which is subsequently compared to the second image and the reference transform function which produces a transformed first image most closely resembling the second image is selected as the best reference transform function.

26. A method according to claim 25 wherein the known illuminant light to which the best reference transform function relates is determined, to provide information relating to the spectral characteristics of the light illuminating the scene to be recorded.

27. A method according to claim 26 wherein at least some of the colour bias due to the illuminating light is removed from the image of the scene to be recorded and/or at least some demosaicing errors and/or interreflection errors and/or shadows present in the recorded image are removed.

28. A method for processing an image recorded using image recording apparatus, the method including the steps of:
   (a) recording a first digital optical image of at least a part of a scene illuminated by an illuminant light and recording a second digital optical image of at least a part of substantially the same scene illuminated by substantially the same illuminant light, the light producing the first and second images undergoing different optical processing; and
   (b) applying at least two reference transform functions to the first or second image, each reference transform function being indicative of the relationship between two digital optical images recorded under different respective known illuminant lights, and
   (c) determining which reference transform function better relates the first and second images.

29. A method according to claim 28 wherein each reference transform function is applied to the first image to produce a transformed first image, which is subsequently compared to the second image and the reference transform function which produces a transformed first image most closely resembling the second image is selected as the best reference transform function.

30. A method according to claim 29 wherein the known illuminant light to which the best reference transform function relates is determined, to provide information relating to the spectral characteristics of the light illuminating the scene to be recorded.

31. A method according to claim 30 wherein at least some of the colour bias due to the illuminating light is removed from the image of the scene to be recorded and/or at least some demosaicing errors and/or interreflection errors and/or shadows present in the recorded image are removed.

* * * * *